United States Patent
Wang et al.

(10) Patent No.: US 10,745,794 B2
(45) Date of Patent: *Aug. 18, 2020

(54) ANTI-AGING PERIODIC VARIABLE REACTION BLACK CHROMIUM COATING FILM AND FORMING METHOD THEREOF

(71) Applicant: CITIC Dicastal CO., LTD., Qinhuangdao, Hebei (CN)

(72) Inventors: Zaide Wang, Qinhuangdao (CN); Huanming Ma, Qinhuangdao (CN); Junfu Li, Qinhuangdao (CN); Shengchao Zhang, Qinhuangdao (CN); Qingwang Wei, Qinhuangdao (CN); Meng Liu, Qinhuangdao (CN)

(73) Assignee: CITIC Dicastal CO., LTD., Qinhuangdao (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/223,346

(22) Filed: Dec. 18, 2018

(65) Prior Publication Data

US 2019/0292654 A1  Sep. 26, 2019

(30) Foreign Application Priority Data

Mar. 21, 2018 (CN) .......................... 2018 1 0232427

(51) Int. Cl.
| | | |
|---|---|---|
| *C23C 14/58* | (2006.01) | |
| *C23C 14/35* | (2006.01) | |
| *C23C 14/20* | (2006.01) | |
| *C23C 14/06* | (2006.01) | |
| *C23C 14/02* | (2006.01) | |
| *C23C 14/00* | (2006.01) | |
| *C23C 22/78* | (2006.01) | |
| *B05D 7/00* | (2006.01) | |
| *B05D 3/10* | (2006.01) | |
| *B05D 3/02* | (2006.01) | |
| *B05D 1/06* | (2006.01) | |

(52) U.S. Cl.
CPC ............ *C23C 14/0057* (2013.01); *B05D 1/06* (2013.01); *B05D 3/0218* (2013.01); *B05D 3/0254* (2013.01); *B05D 3/102* (2013.01); *B05D 7/57* (2013.01); *C23C 14/0015* (2013.01); *C23C 14/024* (2013.01); *C23C 14/0635* (2013.01); *C23C 14/0688* (2013.01); *C23C 14/35* (2013.01); *C23C 14/352* (2013.01); *C23C 22/78* (2013.01); *B05D 2202/25* (2013.01); *B05D 2451/00* (2013.01)

(58) Field of Classification Search
CPC ..... C23C 14/35; C23C 14/205; C23C 14/584; C23C 14/024; C23C 22/78; C23C 14/0015; C23C 14/0057; C23C 144/0084; C23C 14/0635; C23C 14/0688; C23C 14/352; C23C 14/58; B05D 1/06; B05D 3/0254; B05D 3/021; B05D 3/0218; B05D 3/102; B05D 7/57

See application file for complete search history.

(56) References Cited

U.S. PATENT DOCUMENTS

| | | | |
|---|---|---|---|
| 2005/0067273 A1 | 3/2005 | Goodrich | |
| 2019/0284702 A1* | 9/2019 | Wang | ................... C23C 14/58 |
| 2019/0292655 A1* | 9/2019 | Wang | ................... B05D 7/16 |

FOREIGN PATENT DOCUMENTS

| | | |
|---|---|---|
| CN | 101240423 A | 8/2008 |
| CN | 101294270 A | 10/2008 |
| CN | 101343740 A | 1/2009 |
| CN | 105525266 A | 4/2016 |
| CN | 106435489 A | 2/2017 |
| CN | 106435584 A | 2/2017 |
| CN | 106694344 A | 5/2017 |
| JP | H04103777 A | 4/1992 |

OTHER PUBLICATIONS

'Pure' definition. Google search. [https://www.google.com/search?q=pure+definition&rlz=1C1GCEB_en&oq=pure&aqs=chrome.1.69i59l2j69i57j0l2j69i60l3.2455j0j1&sourceid=chrome&ie=UTF-8].*
'Pure' definition. Merriam-Webster Online Dictionary. [https://www.merriam-webster.com/dictionary/pure].*
European Search Report in the European application No. 19162983.1, dated Jul. 17, 2019, 16 pgs.

* cited by examiner

*Primary Examiner* — Michael A Band
(74) *Attorney, Agent, or Firm* — Cooper Legal Group, LLC

(57) ABSTRACT

The disclosure provides an anti-aging periodic variable reaction black chromium coating film, sequentially comprising: an aluminum alloy matrix, a silane conversion film, a high-gloss organic resin coating, a metal compound and metal element periodic variable content alloy coating film, and a transparent resin coating. The disclosure simultaneously provides a method for forming the anti-aging periodic variable reaction black chromium coating film.

6 Claims, No Drawings

ANTI-AGING PERIODIC VARIABLE REACTION BLACK CHROMIUM COATING FILM AND FORMING METHOD THEREOF

CROSS-REFERENCE TO RELATED APPLICATIONS

This application is filed based upon and claims priority to Chinese Patent Application No. 201810232427.2, filed Mar. 21, 2018, the contents of which are hereby incorporated by reference in its entirety.

BACKGROUND

Vapor deposition surface treatment is divided into physical vapor deposition, chemical vapor deposition and physical and chemical mixed vapor deposition, or divided into evaporation, plasma multi-arc sputtering, magnetron sputtering and reactive sputtering according to the principle. Vapor deposition is widely used in the manufacturing industry of automotive parts. Automotive hubs using magnetron sputtering as surface decoration have been applied and promoted in the after-market. The characteristic of vapor deposition is to achieve a metallic mirror gloss decoration effect on the surface of a part. By combining with conventional coating, not only the part is elegant, but also the coating performance can meet the automotive factory standards.

Reactive magnetron sputtering refers to a method in which a reactive gas is introduced to a vacuum chamber during magnetron sputtering to chemically react with the sputtered technical ions to produce a new compound deposited on the surface of a substrate, and the percentage of the compound deposited on the surface of the workpiece is controlled according to the concentration of the introduced reactive gas to form a related alloy coating film. This method can achieve a new black and shiny metallic appearance effect of a glossy mirror, and is environment-friendly and low in cost.

A non-magnetic metal or alloy material is selected as the target according to the requirements of corrosion resistance, weather resistance, decoration and the like of a surface coating of a hub. If the rough surface of the cast aluminum alloy hub is directly coated, a shiny coating cannot be formed. Therefore, a coating must be sprayed onto the hub to form a mirror surface, and then the shiny surface is coated. In order to prolong the long-lasting gloss and long service life of the metal coating film, a transparent powder coating is sprayed onto the coating film to obtain an attractive and durable coating. At the same time, the coating material is required to be well bonded with the upper and lower coatings and also have strong corrosion resistance.

There are many methods using magnetron coating: I, a black clear lacquer is sprayed onto the bright white metal coating film to achieve a bright black chromium appearance; and II, black high gloss resin is sprayed onto the metal coating film to reduce the thickness of the coating film, so that the coating film is translucent, transmits the underlying black and is black and shiny. The above two methods have respective advantages and disadvantages: in the first method, the black clear lacquer easily produces color aberration, the black clear lacquer is different in thickness and color, and the black transparent coating generally has a thickness of 10-30 microns, is poor in protection on the coating film and cannot achieve long-term use standards; and in the second method, the translucent coating film cannot completely cover the underlying resin, and long-term exposure and ultraviolet aging lead to interlayer adhesion failure.

SUMMARY

The disclosure relates to the field of surface treatment, and specifically relates to a hub surface treatment method.

Disclosed herein are an anti-aging periodic variable reaction black chromium coating film and a method of forming the protection film.

An anti-aging periodic variable reaction black chromium coating film, sequentially comprising: an aluminum alloy matrix, a silane conversion film, a high-gloss organic resin coating, a metal compound and metal element periodic variable content alloy coating film and a transparent resin coating.

A silane pretreatment passivation process is adopted for the silane conversion film, and the passivation film improves the binding force between the aluminum alloy and the organic coating and the corrosion resistance of the aluminum alloy surface.

The high-gloss organic resin coating is a coating with extremely high gloss formed by electro-statically spraying an epoxy resin powder coating to the surface of an aluminum alloy hub and curing same in an oven.

The metal compound and metal element periodic variable content alloy coating film contains 0-90% of nickel, 10%-100% of chromium, 0-90% of chromium carbide and 0-90% of nickel carbide, which are deposited on the surface to reach a black and shiny metal color, and the metal gloss of the coating film is adjusted by varying the content of the carbides.

The transparent resin coating is a pure acrylic resin coating having the thickness of 80-150 μm, and the high transparent coating is formed on the coating film by electrostatic powder spraying.

The high-gloss organic resin coating has the thickness of 120-250 μm, and fully covers the aluminum alloy casting surface and the machining knife grains, so that the surface of the aluminum alloy hub achieve a bright and smooth mirror effect.

The chromium, nickel-chromium alloy, chromium carbide and nickel carbide are co-deposited to form the anti-aging periodic variable black chromium coating film for the hub. Working gases including argon and acetylene are introduced and mixed according to a certain ratio, a chromium target is first opened during coating to form a chromium and chromium carbide coating film primer, then a nickel-chromium alloy target is opened, the double targets work together to form a chromium, nickel, nickel-chromium alloy, chromium carbide and nickel carbide deposited film, and finally, only the chromium target is opened to form a chromium and chromium carbide coating film having the overall thickness of 120-200 nm.

A method for forming the anti-aging periodic variable reaction black chromium coating film, comprising the process flow of: silane pretreatment, spraying of high-gloss medium powder, coating, and spraying of transparent powder.

(1) The silane pretreatment on the surface of an aluminum alloy or other metal comprises the steps of hot water washing, de-greasing and alkaline washing, hot water washing, water washing, acid washing, pure water washing, pure water washing, silane passivation, pure water washing, sealing, pure water washing, and moisture drying.

(2) The spraying of a high-gloss powder coating refers to electro-statically spraying an epoxy powder coating or polyester powder coating onto the metal surface of the hub and curing same. After the coating is cured, the surface achieves mirror finish and has good adhesion to the aluminum matrix and good corrosion resistance.

(3) The coating refers to high-vacuum magnetron sputtering on the surface of the hub after curing the medium powder, the sputtering targets include a pure chromium target and a nickel-chromium metal target, the two targets are set with different power according to the colors and opened for coating according to the process sequence, the hub can auto-rotate and revolve in the equipment, premixed gas of argon and acetylene is introduced during coating to form a chromium and chromium carbide coating film primer having the thickness of 5-10 nm, the formed coating film has good adhesion to the high-gloss organic coating, then the nickel-chromium alloy target is opened, the double targets work together to form a chromium, nickel, nickel-chromium alloy, chromium carbide and nickel carbide deposited film having the thickness of 80-150 nm, finally, only the chromium target is opened to form a chromium and chromium carbide coating film having the thickness of 5-10 nm, and the entire reaction coating thickness is 120-250 nm. When sputtering to the surface of the hub in a certain sequence and ratio, the auto-rotation and revolution of the hub cause the surface coating film to be uniform in thickness and color, and the coating film has good binding force with the underlying high-gloss resin coating.

(4) The spraying of transparent powder in the process refers to spraying transparent powder onto the surface of the coated hub and curing same, the transparent powder is an acrylic resin or polyester powder coating, the transparent coating has good binding force with the coating film, and the resin itself also has aging resistance and other properties.

In step (1) of pretreatment on the surface, the passivation is for a silane conversion film, the baking temperature of a moisture oven is 150° C., the baking time is 30 min, and the conversion film improves the corrosion resistance of the aluminum alloy surface.

In step (2), the high-gloss medium powder is sprayed with a thickness of 80 to 150 μm, the spoke surface curing temperature is 220° C., the curing time is 20 min, epoxy resin is preferred, and the hardness of the cured coating is 2-3H. The high-gloss medium powder may be black or other color. The coated aluminum alloy surface has good adhesion and strong corrosion resistance. After curing, the coated surface reaches a mirror finish, and the glass transition temperature of the coating is preferably 80-120° C.

In step (3), the temperature of the coated workpiece is 80-150° C., the hardness of the coating is reduced and the adhesion of the coating film and the coating is improved, the flow rate of the working gas argon is 40-80 cc/min, the coating current for the chromium target and the nickel-chromium alloy target is 15-30 A, and the voltage is more than or equal to 550 v and less than 800 v; the vacuum degree is $(2-8) \times 10^{-3}$ Pa, the double target coating time is 15-40 s, the working gas is 99.999% argon, and the reaction gas is acetylene having the purity of 99.999%; The coating environment humidity is less than or equal to 50%. In the coating sequence, premixed gas of argon and acetylene is introduced first, then a pure chromium power supply is turned on for coating 3-7 seconds, the double targets are simultaneously opened for 14-24 seconds, finally the pure chromium is separately coated for 3-7 seconds, the hub rotates while being sputtered, a periodic variable alloy black chromium coating film is formed, and the targets are cooled at a temperature of 15-20° C. to avoid the color change of the reaction coating film due to a too high temperature.

In step (3), argon and acetylene are premixed in advance, the percentage of the acetylene in the mixed gas can be adjusted from 0 to 90%, and the total gas flow is 120-400 cc/min. The lower the concentration of the acetylene, the higher the brightness of the coating film. The higher the concentration of the acetylene, the lower the brightness of the coating film and the darker the color. The brightness color L value can be adjusted between 55 and 85.

In step (4), the pure acrylic transparent powder is sprayed with a thickness of 80-150 μm, the surface curing temperature of the hub is 177° C., the curing time is 20 min, and the hardness of the coating is H level. The coating has excellent aging resistance, does not change in color after long-term use, does not lower the adhesion, has good binding force with the coating film, effectively protects the coating film from being damaged during use, and prolongs the service life of the coating film. Acrylic transparent paint may also be sprayed after the polyester transparent powder is sprayed and cured.

The method for forming the anti-aging periodic variable reaction black chromium coating film according to the disclosure has the advantages of: (1) increasing the thickness of the black chromium coating film, and adjusting the color L value of the coating film; (2) eliminating the residual stress of the deposited layer, and solving the problem of cracking during heating and cooling when the transparent powder is sprayed onto the coating film; (3) improving the binding force between the coating film and the underlying high-gloss resin material; (4) improving the binding force between the coating film and the surface transparent coating and the durability of the binding force; (5) forming the black-chromium and bright appearance, and achieving the effects of beautifying and decoration; (6) achieving good corrosion resistance in the coating system; (7) achieving strong coating film thickness coverage to effectively prevent ultraviolet transmission and improve the durability and the aging resistance; and (8) green coating, instead of other coating methods of the same color, and environmental protection. The above problems are basically solved after adopting this new reaction mixed material coating process. The technical solution of the disclosure can also be applied to other purposes such as electronic product cases and car interior and exterior trims.

DETAILED DESCRIPTION

Two kinds of targets are used in the embodiments of the coating method of the disclosure, one is a pure chromium target containing 99.95% of chromium by mass, and the other one is a nickel-chromium alloy having the purity of 99.95% and containing 18% of nickel. The working gas is argon having the purity of 99.999%; the reaction gas is acetylene having the purity of 99.999%; the equipment is a high-vacuum magnetron sputtering coating machine, and can be used for a reactive sputtering coating process. The aluminum wheel material is A356.2 aluminum alloy; the pretreatment adopts silane passivation treatment; the high-gloss medium coating is made of an epoxy powder coating; and the transparent coating is made of a pure acrylic transparent powder coating.

The coating is inspected in accordance with the US general motor hub coating performance standards, and the inspection items include Adhesion Cross-Cut Test, CASS, FLIFORM, high humidity resistance test, coating ultraviolet aging resistance, etc.

A method for forming an anti-aging periodic variable reaction black chromium coating film includes the process flow of: silane pretreatment, spraying of high-gloss medium powder, coating, and spraying of transparent powder.

(1) The silane pretreatment includes the steps of hot water washing, de-greasing and alkaline washing, hot water washing, water washing, acid washing, pure water washing, pure water washing, silane passivation, pure water washing, sealing, pure water washing, and moisture drying.

(2) The spraying of a high-gloss powder refers to electrostatically spraying an epoxy powder coating onto the metal surface of a hub and curing same, in which the base powder is epoxy resin powder or a polyester powder coating. After the coating is cured, the surface achieves mirror finish and has good adhesion to the aluminum matrix. The spraying thickness is 150 μm.

(3) High-vacuum magnetron sputtering is performed on the surface of the hub after curing the medium powder, the sputtering targets include a pure chromium target and a nickel-chromium metal target, the sprayed high-gloss medium powder is completely cured, the temperature of the hub is 100° C., argon is introduced with the flow rate of 80 cc/min, the flow rate of acetylene is 240 cc/min, and the coating current is 15 A for the pure chromium target and 18 A for the nickel-chromium alloy target; the vacuum degree is $5\times10^{-3}$ Pa, the mixed gas is introduced, the pure chromium alloy is opened at the first stage, the coating time is 6 s, and the auto-rotation and revolution time is 3 s/rev; the pure chromium target and the nickel-chromium alloy target are opened at the second stage, the coating time is 30 s, and the auto-rotation and revolution time is 3 s/rev; and the pure Cr target is opened at the third stage, the coating time is 6 s, and the auto-rotation and revolution time is 3 s/rev. The nickel-chromium alloy used is an alloy material having the nickel content of 80%.

(4) The spraying of transparent powder refers to spraying transparent powder onto the surface of the hub after the PVD coating and curing same, the transparent powder is an acrylic resin powder coating, the transparent coating has good binding force with the coating film, and the resin itself also has aging resistance and other properties.

Comparative Example 1

A PVD protective layer is prepared using a common method in the art. The target is a single pure Cr target, the base powder is black, and the PVD semi-permeable film reaches a black chromium coating film. The adopted process method and coating structure are the same as those of the preparation method of the disclosure.

Comparative Example 2

A PVD protective layer is prepared using a common method in the art. The target is a single NiCr alloy target, the base powder is black, and the PVD semi-permeable film reaches a black chromium coating film. The adopted process method and coating structure are the same as those of the preparation method of the disclosure.

The following tests and comparisons are carried out using the multi-layer sputtered coatings with metal surface ductility in example 1 and comparative examples 1 and 2, as shown in the following table:

| Group | Example 1 | Comparative Example 1 | Comparative Example 2 |
| --- | --- | --- | --- |
| Coating color | L = 65.0, a = 0.1, b = −2.2 | L = 64.5, a = 0.1, b = −2.2 | L = 65.2, a = 0.1, b = −2.2 |
| Surface cracking | No cracks | Cracked | No cracks |
| Coating film thickness | 130 nm | 56 nm | 58 nm |
| Adhesion Cross-Cut Test | 100% shedding-free | 100% shedding-free | 100% shedding-free |
| CASS | 1.0 mm | 1.6 mm | 3.8 mm |
| FLIFORM | 2.3 mm | 3.1 mm | 5.8 mm |
| Water resistance test | No change, adhesion 100% shedding-free | No change, adhesion 91% shedding-free | No change, adhesion 77% shedding-free |
| Anti-aging | No change, adhesion 100% coating film shedding-free | No change, adhesion 65% coating film shedding-free | No change, adhesion 61% coating film shedding-free |

It can be seen that in the method of the disclosure, the coating temperature, the argon flow rate, the acetylene flow rate, the coating current, the vacuum degree, the NiCr alloy target and the pure Cr coating time are the key parameters, and the mixing proportion of acetylene and argon and the coating parameters are the key of obtaining the coating film color, thickness and aging resistance. A coating film with good properties is obtained by the above process. In the disclosure, the technical solution of the example obtains the optimal condition by exploring the above conditions. Coating test results are best under this optimal condition.

The invention claimed is:
1. A method for forming an anti-aging black chromium coating film, comprising:
   (1) silane pretreating a surface of an aluminum alloy wheel, comprising subjecting the surface of the aluminum alloy wheel to all of the following steps:
      hot water washing,
      de-greasing and alkaline washing,
      hot water washing,
      water washing,
      acid washing,
      pure water washing,
      pure water washing,
      silane passivating,
      pure water washing,
      sealing,
      pure water washing, and
      moisture drying,
   (2) forming a high-gloss powder coating on the silane pretreated surface of the aluminum alloy wheel, by electrostatically spraying an epoxy powder coating material or a polyester powder coating material onto the silane pretreated surface of the aluminum alloy wheel from (1) and then curing the epoxy powder coating material or the polyester powder coating material,
   (3) depositing a physical vapor deposition (PVD) coating on the high-gloss powder coating by a high-vacuum magnetron sputtering coating machine which is provided with a pure chromium target and a nickel-chromium alloy target,
   wherein a power of the pure chromium target and a power of the nickel-chromium alloy target are set with different power according to a color of the PVD coating, wherein the aluminum alloy wheel rotates and revolves in the high-vacuum magnetron sputtering coating machine, wherein the PVD coating has an adhesion to the high-gloss powder coating, wherein a thickness of the PVD coating is 120-250 nm, wherein the depositing the PVD coating on the high-gloss powder coating comprises:

introducing a premixed gas of argon and acetylene into a chamber of the high-vacuum magnetron sputtering coating machine, wherein the argon is used as a working gas and the acetylene is used as a reactive gas, first only sputtering the pure chromium target, so as to form a first film of chromium and chromium carbide with a thickness of 5-10 nm, secondly sputtering the pure chromium target and the nickel-chromium alloy target simultaneously, so as to form a second film of chromium, nickel, nickel-chromium alloy, chromium carbide and nickel carbide with a thickness of 80-150 nm, and finally only sputtering the pure chromium target, so as to form a third film of chromium and chromium carbide with a thickness of 5-10 nm, and (4) spraying transparent powder on the PVD coating and curing the transparent powder, wherein the transparent powder is an acrylic resin or a polyester powder coating material.

2. The method for forming the anti-aging black chromium coating film according to claim 1, wherein in (1), a silane conversion film is formed on the surface of the aluminum alloy wheel during the silane passivating, and the moisture drying is performed in an oven at a temperature of 150° C. for 30 min.

3. The method for forming the anti-aging black chromium coating film according to claim 1, wherein in (2), the high-gloss powder coating is sprayed to have a thickness of 80 to 150 μm, a curing temperature of the epoxy powder coating material or the polyester powder coating material is 220° C., a curing time of the epoxy powder coating material or the polyester powder coating material is 20 min, and a hardness of the high-gloss powder coating obtained in (2) is 2H-3H; and after curing, a surface of the high-gloss powder coating reaches a mirror finish, and a glass transition temperature of the high-gloss powder coating is 80-120° C.

4. The method for forming the anti-aging black chromium coating film according to claim 1, wherein in (3), a temperature of the aluminum alloy wheel is 80-150° C., a flow rate of the working gas in the premixed gas is 40-80 cc/min, electric currents for the pure chromium target and the nickel-chromium alloy target are 15-30 A, a vacuum degree in the high-vacuum magnetron sputtering coating machine is $2\times10^{-3}$-$8\times10^{-3}$ Pa, the working gas is 99.999% argon, and the reactive gas is acetylene having a purity of 99.999%; an environment humidity for depositing is less than or equal to 50%; the depositing the PVD coating on the high-gloss powder coating comprises: after the premixed gas of argon and acetylene is introduced, first the pure chromium target is sputtered for 3-7 seconds, and then the pure chromium target and the nickel-chromium alloy target are sputtered simultaneously for 14-24 seconds, and finally the pure chromium target is sputtered for 3-7 seconds, such that the PVD coating is formed, the aluminum alloy wheel rotates while being sputtered, and the pure chromium target and the nickel-chromium alloy target are cooled at a temperature of 15-20° C.

5. The method for forming the anti-aging black chromium coating film according to claim 1, wherein in (3), the argon and the acetylene are premixed in advance, a percentage of the acetylene in the premixed gas is more than 0% and less than or equal to 90%, and a total gas flow is 120-400 cc/min; and a brightness color L value of the PVD coating is between 55 and 85.

6. The method for forming the anti-aging black chromium coating film according to claim 1, wherein in (4), the transparent powder is sprayed to have a thickness of 80-150 μm, a curing temperature of the transparent powder is 177° C., a curing time of the transparent powder is 20 min, and a hardness of the transparent powder after curing is 1H.

* * * * *